US012770711B2

(12) United States Patent
Guo et al.

(10) Patent No.: US 12,770,711 B2
(45) Date of Patent: Oct. 20, 2026

(54) LOGIC-BASED DEFECTIVE MEMORY COMPONENT SCREENING

(71) Applicant: Micron Technology, Inc., Boise, ID (US)

(72) Inventors: Zimu Guo, Milpitas, CA (US); Wei Wang, Fremont, CA (US); Jiangli Zhu, San Jose, CA (US); Selvy Octavia, Singapore (SG); Heng Yie Chan, Singapore (SG)

(73) Assignee: MICRON TECHNOLOGY, INC., Boise, ID (US)

( * ) Notice: Subject to any disclaimer, the term of this patent is extended or adjusted under 35 U.S.C. 154(b) by 142 days.

(21) Appl. No.: 18/944,422

(22) Filed: Nov. 12, 2024

(65) Prior Publication Data

US 2026/0134940 A1 May 14, 2026

(51) Int. Cl.
*G11C 29/00* (2006.01)
*G11C 29/52* (2006.01)

(52) U.S. Cl.
CPC .............. *G11C 29/76* (2013.01); *G11C 29/52* (2013.01); *G11C 29/808* (2013.01)

(58) Field of Classification Search
CPC ........ G11C 29/76; G11C 29/52; G11C 29/808
See application file for complete search history.

(56) References Cited

U.S. PATENT DOCUMENTS

2004/0181733 A1* 9/2004 Hilton .................. G11C 7/1006 714/758

* cited by examiner

*Primary Examiner* — Han Yang
(74) *Attorney, Agent, or Firm* — NICHOLSON DE VOS WEBSTER & ELLIOTT LLP

(57) ABSTRACT

Exemplary methods, apparatuses, and systems include logic-based defective memory component screening. A defectivity manager reads a defective byte map of memory having separately accessible chunks of memory. Each chunk of memory has a number of bytes addressable in a physical and logical domain. Each chunk of the memory is allocated a number of bytes to repair defective bytes. The defectivity manager maps a number of defective bytes in a chunk of a memory in the physical domain to a number of sub-segments of the memory in the logical domain. The defectivity manager writes, to a portion of the memory, an address of a defective byte in the chunk of the memory for repair in response to determining that an available number of bytes allocated to repair defective bytes satisfies a number of defective bytes in a sub-segment of the number of sub-segments of the memory in the logical domain.

20 Claims, 6 Drawing Sheets

LOGIC-BASED DEFECTIVE MEMORY COMPONENT SCREENING

TECHNICAL FIELD

The present disclosure generally relates to managing defective memory components, and more specifically, relates to logic-based defective memory component screening.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
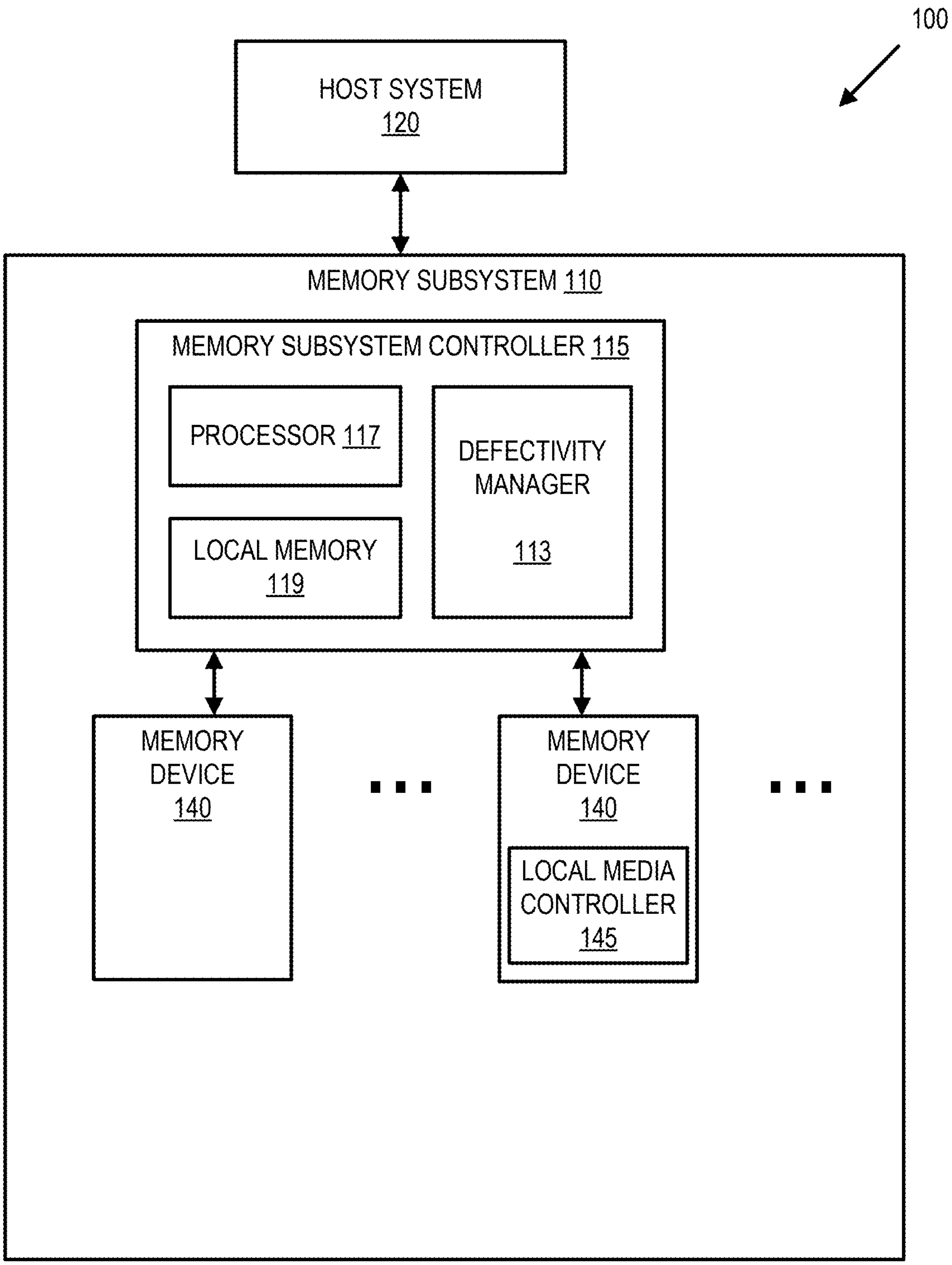
FIG. 1 illustrates an example computing system that includes a memory subsystem in accordance with some embodiments of the present disclosure.

Aspects of the present disclosure are directed to logic-based defective memory component screening. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information and has various logic states that correlate to the number of bits being stored. The logic states can be represented by binary values, such as “0” and “1”, or combinations of such values. There are various types of cells, such as single-level cells (SLCs), multi-level cells (MLCs), triple-level cells (TLCs), quad-level cells (QLCs), and penta-level cells (PLCs). For example, an SLC can store one bit of information and has two logic states while a QLC can store sixteen bits of information and has sixteen logic states.

Defects can be introduced during manufacturing and operation that may prevent a memory component from being properly programmed. When attempting to program a memory component containing defects, user data being written to the memory component can be lost when the programming fails. To mitigate the defective portions of memory, memory components are allocated a predetermined number of bytes of memory that are available to “repair” the defective portions. For example, 12 bytes of memory are available to repair a plane of a die that has a defective portion.

In conventional memory systems, if a number of bytes of defective memory satisfies a defectivity threshold, then the memory component (e.g., die) is discarded. In such conventional systems, screening memory components for defective memory is performed in the physical domain. For example, in some conventional systems, if a 1 kilobyte physical chunk of a plane has more than 12 bytes of defective memory, then the plane satisfies a defectivity threshold and the entire die is discarded, regardless of the defectivity or reliability of the other planes of the die.

Aspects of the present disclosure address the above and other deficiencies by repairing memory components using a logic-based screening. Screening defective memory components in the logical domain, as opposed to the physical domain, can increase the yield of memory components (i.e., the number of memory components that fail to satisfy a defectivity threshold). As a result, more memory components are deployed, which decreases the cost of manufacturing memory components in terms of time, manufacturing resources, and the financial burden associated with manufacturing such memory components. The logic-based defective memory component screening, as described herein, reduces the number of memory components identified as being defective without compromising the performance of the memory component during deployment.

Additionally, screening defective memory components in the logical domain can include consideration of error correction capabilities of a memory system. For example, error correction techniques address data read errors in the logical domain. Screening defective memory components in the logical domain includes redistributing defective portions of memory from the physical domain to the logical domain. The redistribution of the defective portions of memory to the logical domain enables error correction strategies that operate in the logical domain to compensate for the defective portions of memory components. Accordingly, a number of defects of a memory component can be forgiven using logic-based defective memory component screening even if such defects would make the memory component conventionally defective within a portion of physical addressing.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory device 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a defectivity manager 113 that screens for defective memory components in the logical domain as opposed to the physical domain. In some embodiments, the controller 115 includes at least a portion of the defectivity manager 113. For example, the controller 115 can include a processor 117 (processing device) configured to execute instructions stored in local memory 119 for performing the operations described herein. In some embodiments, the defectivity manager 113 is part of the host system 120, an application, or an operating system.

The defectivity manager 113 can map defects in the physical domain to defects in the logical domain, redistributing the number of defects in a portion of memory. The defectivity manager 113 selectively repairs defects in the portion of memory using redundant memory allocated for repairs. The defective portion of memory is redirected to the redundant portion of memory by mapping the address of the redundant portion of memory and the defective portion of memory and storing the address of the redundant portion of memory in ROM (e.g., memory device 130). Further details with regard to the operations of the defectivity manager 113 are described below.

Figure 2:
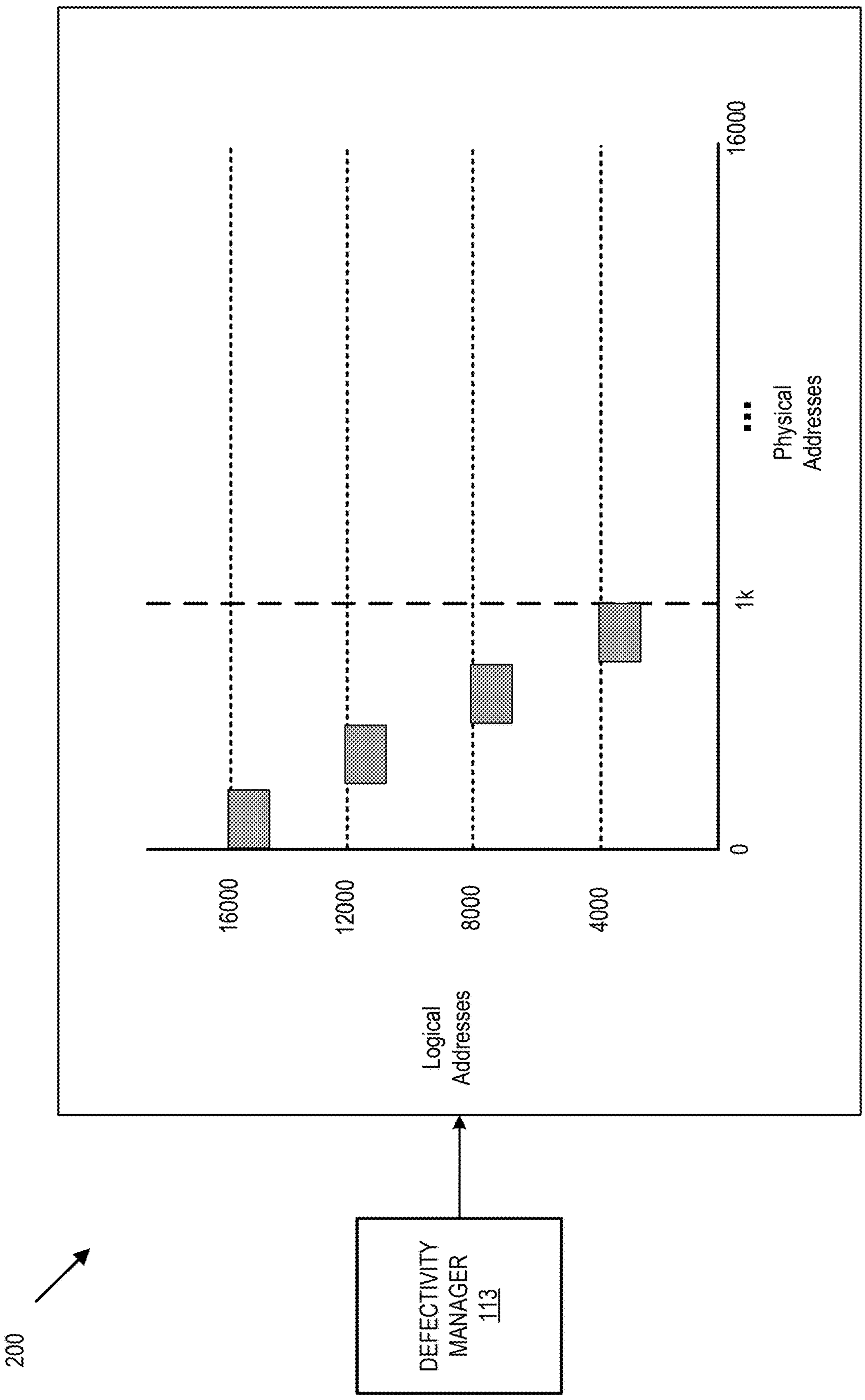
FIG. 2 illustrates an example of a physical domain to logical domain mapping performed by the defectivity manager, in accordance with some embodiments of the present disclosure.

FIG. 2 illustrates an example 200 of a physical domain to logical domain mapping performed by the defectivity manager 113, in accordance with some embodiments of the present disclosure. As shown in example 200, the memory has separately accessible portions of memory. For example, a memory device includes multiple die, and each die includes multiple planes.

Data is written to and read from physical blocks in each of the planes. Logical addresses are used by host systems for generating memory requests (e.g., read and write requests) that refer to the physical portions of memory (e.g., the physical blocks in the plane), whereas physical addresses are used by the memory device to identify the portions of memory that are used to fulfill the memory requests.

Logical addresses refer to memory in the logical domain, whereas physical addresses refer to memory in the physical domain, i.e., the physical domain is different from the logical domain. For example, given 16 kilobytes for a page of memory, the physical domain of that page can be addressed using 16×1 kilobytes of memory, whereas the logical domain of that memory can be addressed using 4×4 kilobytes of memory.

In example 200, the defectivity manager 113 maps a single 1 kilobyte range of physical addresses (e.g., a 1 k chunk) of the 16 kilobytes of memory to four 4 kilobyte ranges of logical addresses (e.g., distributing the 1 k chunk in four portions across a 16 k segment including four 4 k sub-segments).

As shown in example 200, the defectivity manager 113 maps a 1 k chunk in the physical domain to four 4 k sub-segments in the logical domain. As a result of such mapping, the defects in the 1 k chunk in the physical domain are distributed across multiple sub-segments in the logical domain.

Figure 3:
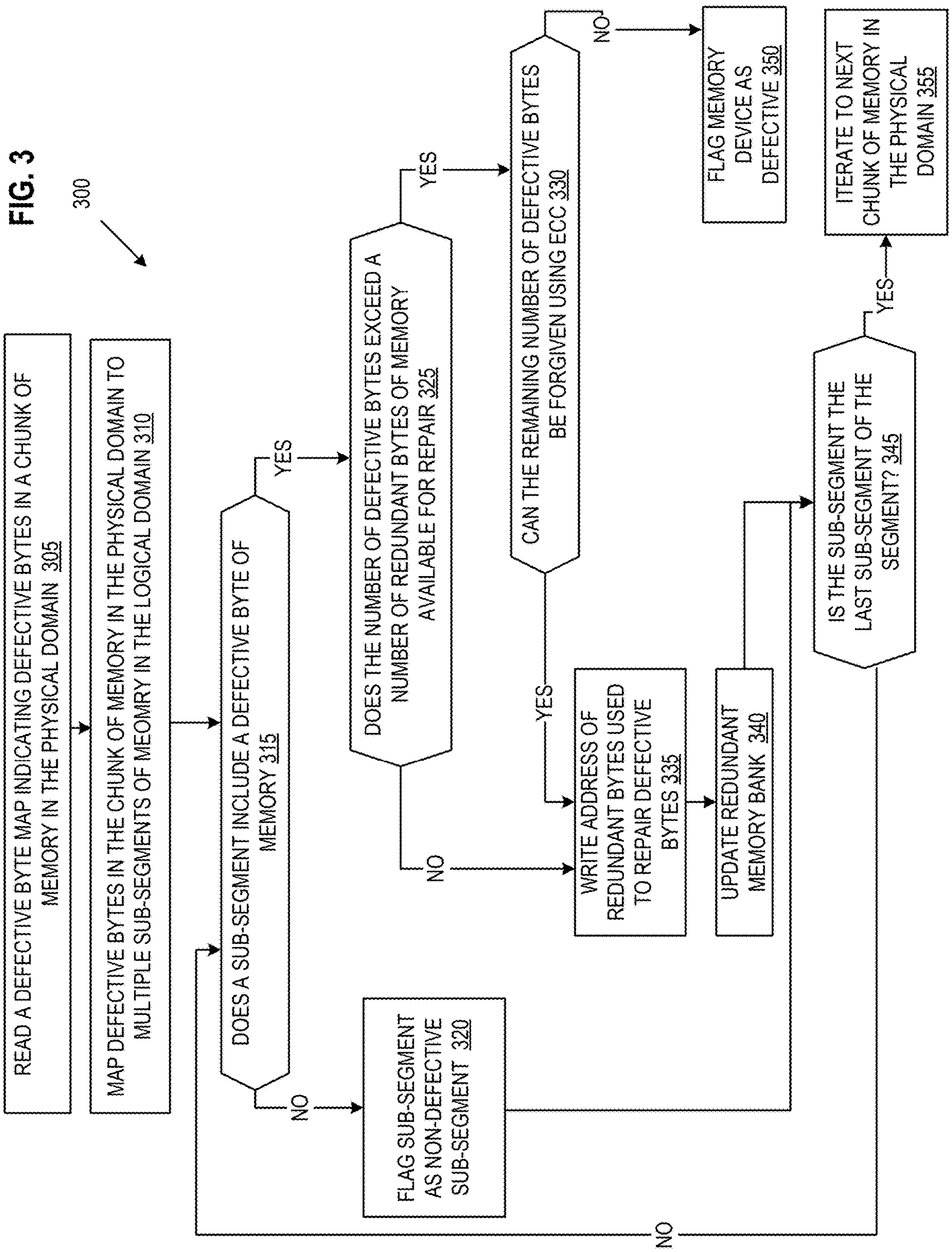
FIG. 3 is a flow diagram of an example method to screen defective memory components in the logic domain, in accordance with some embodiments of the present disclosure.

FIG. 3 is a flow diagram of an example method 300 to screen defective memory components in the logic domain, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the defectivity manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing device reads a defective byte map indicating physical addresses of defective memory. The defective byte map indicates physical addresses of defective bytes of memory in a chunk of memory in the physical domain.

At operation 310, the processing device maps the physical addresses of defective bytes in the chunk of memory in the physical domain identified in the defective byte map to logical addresses of defective bytes in sub-segments of memory in the logical domain. As described with reference to FIG. 2, the defectivity manager 113 maps a single chunk of addresses in the physical domain to multiple sub-segments of addresses in the logical domain using any one or more physical to logical mapping techniques.

At operation 315, the processing device determines whether a sub-segment of the segment of memory in the logical domain includes a defective byte of memory. For example, as described with reference to FIG. 2, the defectivity manager 113 maps a 1 k chunk in the physical domain to four 4 k sub-segments in the logical domain. As a result of such mapping, the defects in the single 1 k chunk in the physical domain are distributed across multiple sub-segments in the logical domain. For example, assume the single 1 k chunk in the physical domain includes five defective bytes of memory (e.g., indicated via the defective byte map of the 1 k chunk of memory in the physical domain as described at operation 305). Responsive to the mapping from the physical domain to the logical domain at operation 310, the five defective bytes of memory in the 1 k chunk of memory in the physical domain are distributed across four 4 k sub-segments of memory in the logical domain. For example, the first 4 k sub-segment of memory in the logical domain includes three defective bytes of memory, both of the second and third 4 k sub-segments in the logical domain include one defective byte of memory, and the fourth 4 k sub-segment of memory in the logical domain includes no defective bytes of memory. At operation 315, the defectivity manager 113 determines that the first 4ksub-segment of memory in the logical domain includes defective bytes of memory (e.g., three defective bytes) by virtue of the physical chunk to logical segment mapping performed at operation 310. In contrast, the fourth 4 k sub-segment of memory in the logical domain does not include defective bytes of memory by virtue of the physical chunk to logical segment mapping performed at operation 310. In some embodiments, at operation 315, the defectivity manager evaluates whether the sub-segment includes a threshold number of defective bytes of memory. If the sub-segment does not include a defective byte of memory, then the flow of operations moves to operation 320. If the sub-segment includes a defective byte of memory, then the flow of operations moves to operation 325.

At operation 320, the processing device flags the sub-segment of the memory as a non-defective sub-segment of memory. In some embodiments, the defectivity manager 113 flags the sub-segment of the memory as a non-defective portion of the memory by assigning an identifier to the sub-segment of the memory.

At operation 325, the processing device determines whether the number of defective bytes exceeds a number of redundant bytes of memory available for repair. A redundant memory bank stores a limited number of bytes of memory allocated for defective memory repairs. In some embodiments, each sub-segment of memory in the logical domain is assigned a redundant memory bank used for repairs. For example, each 4 k sub-segment of the four 4 k sub-segments of the 16 k segment in the logical domain are assigned a redundant memory bank. In some embodiments, the 16 k segment of memory in the logical domain is assigned a redundant memory bank that is used to repair defective memory across all four of the sub-segments of memory. In some embodiments, the chunk of memory in the physical domain is assigned a redundant memory bank that is used to repair defective memory. For example, the single 1 k chunk of memory in the physical domain is assigned a redundant memory bank. The defectivity manager 113 repairs defective bytes of memory across each of the four 4 k sub-segments of memory in the logical domain using the single shared redundant memory bank. In other embodiments, the die is assigned a redundant memory bank and the defectivity manager 113 repairs defective bytes of memory of the die using the single shared redundant memory bank. In some embodiments, multiple chunks of memory in the physical domain are assigned a single redundant memory bank that is used to repair defective memory across multiple segments of memory in the logical domain. It should be appreciated that other granularities of portions of the memory device (e.g., pages, blocks, or the memory package) can share the single redundant memory bank.

The redundant portions of memory (e.g., bytes) are addressable in the logical domain and/or the physical domain such that the defectivity manager 113 can assign redundant portions of memory to defective portions of memory, thereby repairing the defective bytes of memory in sub-segments in the logical domain, thereby repairing the defective bytes of memory in chunks of the physical domain. The defectivity manager 113 compares the number of available redundant bytes of memory of the redundant memory bank to the number of defective bytes of memory in a sub-segment. If the number of bytes in the sub-segment exceeds the available number of redundant bytes, then the flow of operations moves to operation 330. If the number of bytes identified in the sub-segment does not exceed the available number of redundant bytes, then the flow of operations moves to operation 335.

At operation 330, the processing device determines whether a remaining number of defective bytes (i.e., in excess of the available number of redundant bytes) can be forgiven using ECC. The defectivity manager 113 determines the remaining number of defective bytes by taking a difference between the number of defective bytes in the sub-segment of memory in the logical domain and the number of redundant bytes of memory available for repair. When memory devices are deployed for operational use, such devices are configured with error correcting capabilities, read error handling, and other methods of correcting errors The error correcting capability of the memory device can be a result of experimentation or operational testing. Portions of a memory device can have an increased probability of error during operational use of the memory device given a number of defective bytes in the portion of memory. However, the increased probability of error during operational use of the memory device given the defective bytes is offset by the error correction capability of the memory device such that the memory device can tolerate an increased number of bytes of memory that are defective. As a result, the defectivity manager 113 can "forgive" a number of defective bytes in the sub-segment of memory in the logical domain if the ECC capability of the memory device compensates for the remaining number of defective bytes in the sub-segment. For example, assume there are two bytes of redundant memory available to repair the three defective bytes in the first 4 k sub-segment in the logical domain. The remaining number of defective bytes of the first 4 k sub-segment in the logical domain is one defective byte. As long as the ECC of the memory device can correct operations with a defect in at least one defective byte of memory, the defectivity manager 113 will forgive the remaining one defective byte in the first 4 k sub-segment in the logical domain. In operation, the defectivity manager 113 omits from repair the one defective byte from the set of three defective bytes in the first 4 k sub-segment in the logical domain because of the ECC capability of the memory device. If the ECC of the memory device can correct the remaining number of defective bytes in the sub-segment, the flow of operations moves to operation 335. If the ECC of the memory device cannot correct the remaining number of defective bytes in the sub-segment, the flow of operations moves to operation 350.

At operation 350, the processing device flags the memory device as defective. For example, the defectivity manager 113 assigns a defective identifier to one or more portions of memory indicating the defectivity of the entire memory device. In some embodiments, memory devices with a single portion of memory assigned the defective identifier are discarded. For example, if one 4 k sub-segment of a 16 k segment of memory in the logical domain is assigned the defective flag, then the entire memory device is identified as defective.

At operation 335, the processing device writes addresses of redundant bytes of memory used to repair the defective bytes of memory. For example, the defectivity manager 113 maps the one or more defective bytes in a sub-segment of memory in the logical domain to the corresponding chunk of memory in the physical domain as discussed above. The defectivity manager 113 then maps the address of the defective byte of memory in the chunk of the physical domain to one or more redundant bytes of memory in the redundant memory bank. As a result, memory operations directed to the defective physical address are redirected the redundant physical address used to make the repair. In one embodiment, the defectivity manager 113 writes the addresses of the redundant bytes of memory to another portion of memory (such as ROM or memory device 130 described in FIG. 1) to redirect the defective bytes of memory to the redundant bytes of memory.

At operation 340, the processing device updates the redundant memory bank. For example, the defectivity manager 114 updates the available number of bytes of redundant memory according to the number of redundant bytes of memory mapped to the defective bytes of memory in operation 335. The defectivity manager 113 subtracts the number of redundant bytes of memory used to redirect the defective bytes of memory from a number of available redundant bytes of memory of the redundant memory bank. The difference represents the updated number of available redundant bytes of memory of the redundant memory bank.

At operation 345, the processing device determines whether the sub-segment (found to be non-defective or otherwise forgiven or repaired by the defectivity manager 113) is the last sub-segment in the segment of memory in the logical domain. If the sub-segment is the last sub-segment (e.g., the fourth 4 k sub-segment of the four 4 k sub-segments of the segment of memory in the logical domain), the flow of operations moves to operation 355. If the sub-segment is not the last sub-segment, the flow of operations returns to operation 315 for the next sub-segment. For example, after repairing the two defective bytes and forgiving one defective byte in the first 4 k sub-segment of the four 4 k sub-segments in the logical domain, the defectivity manager 113 iterates to a next sub-segment of the segment and evaluates whether the second 4 k sub-segment of the four 4 k sub-segments in the logical domain includes any defective bytes at operation 315.

At operation 355, the processing device iterates to a next chunk of memory in the physical domain of the memory device. In some embodiments, the defectivity manager 113 assigns a non-defective flag to each sub-segment in the logical domain that has had defective bytes repaired using redundant bytes of memory, forgiven using ECC, and/or does not include defective bytes. Responsive to non-defective flags assigned to each sub-segment of the segment in the logical domain, the defectivity manager 113 flags the chunk of the memory in the physical domain as not defective (and/or the defectives are forgiven or repaired) using a non-defective flag. Responsive to the non-defective flag assigned to each chunk of memory in the physical domain (e.g., physical block), the defectivity manager 113 flags the memory device as not defective (or the defects are forgiven or repaired) using the non-defective flag. Memory devices assigned the non-defective flag are deployed for operational use.

Figure 4:
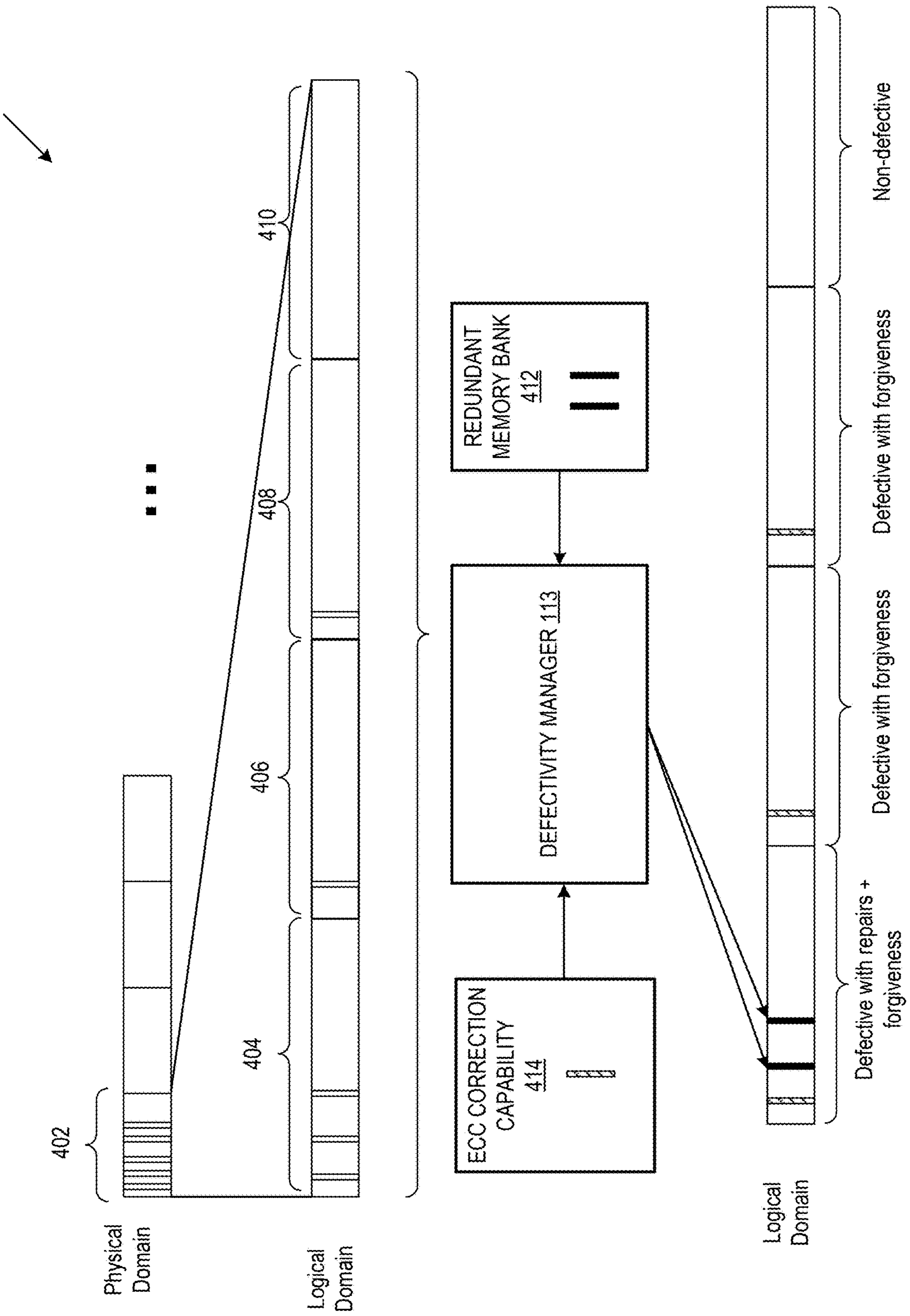
FIG. 4 illustrates an example of logic-based defective memory screening, in accordance with some embodiments of the present disclosure.

FIG. 4 illustrates an example 400 of logic-based defective memory screening, in accordance with some embodiments of the present disclosure. The chunk 402 illustrated in example 400 illustrates a 1 k range of addresses in the physical domain. The white bars in chunk 402 represent defective bytes of memory (e.g., a physical address of defective bytes of memory). As shown, there are five white bars in the chunk 402, representing five defective bytes of memory. In example 400, there are two bytes of redundant memory (represented as black bars in the redundant memory bank 412) that can be used to repair the defective bytes of memory. In example 400, the error correction capability 414 of the memory device is one byte of memory for each sub-segment of memory in the logical domain (represented as a hash-pattern bar in example 400).

As described with reference to operation 310 of FIG. 3, the defectivity manager 113 maps addresses in a chunk of memory in the physical domain to addresses in sub-segments of a segment in the logical domain using any one or more physical to logical mapping methods. When the defectivity manager 113 maps the addresses of bytes of memory in the physical domain to addresses of bytes of memory in the logical domain, the defectivity manager 113 distributes the five defective bytes of memory in the chunk 402 of the physical domain to the four sub-segments of memory in the logical domain. As shown, three defective bytes are mapped to the first sub-segment 404, one defective byte is mapped to the second sub-segment 406 and the third sub-segment 408 respectively, and the fourth sub-segment does not include any defective bytes of memory.

As described with reference to operation 325 in FIG. 3, the defectivity manager 113 determines that the three bytes of defective memory in sub-segment 404 exceed the two bytes of redundant memory available in the redundant memory bank 412. However, the remaining number of defects in the sub-segment 404 (e.g., three defective bytes of memory−two redundant bytes of memory=1 remaining byte of memory) can be forgiven according to the one-byte ECC capability 414. Accordingly, although sub-segment 404 is potentially defective (by virtue of including three defective bytes of memory), sub-segment 404 can be repaired using the redundant memory and forgiven according to the ECC capability of the memory device.

As described with reference to operation 325 in FIG. 3, the defectivity manager 113 determines that the one byte of defective memory in sub-segment 406 exceeds the zero bytes of redundant memory available in the redundant memory bank 412 (by virtue of the two available bytes of memory in the redundant memory bank 412 being assigned to the two defective bytes of memory in sub-segment 404). However, the remaining number of defects in the sub-segment 406 (e.g., one defective byte of memory) can be forgiven according to the one-byte ECC capability 414. Accordingly, although sub-segment 406 is also potentially defective (by virtue of including one defective bye of memory), sub-segment 406 is forgiven according to the ECC capability of the memory device. The same reasoning and processes are applied to the sub-segment 408.

With reference to operation 315 of FIG. 3, the defectivity manager 113 determines that the sub-segment 410 is not defective because defective bytes of the physical chunk were not mapped to sub-segment 410.

Figure 5:
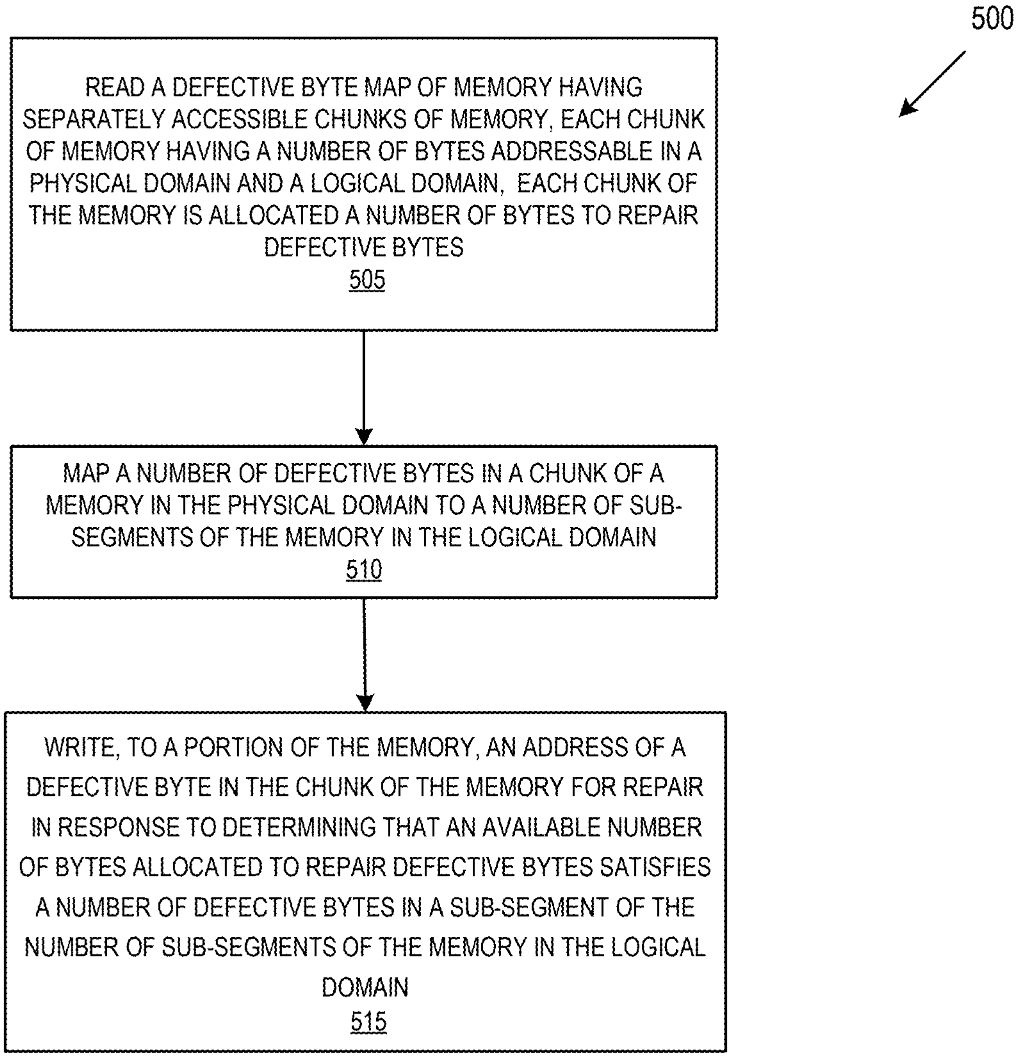
FIG. 5 is a flow diagram of an example method of logic-based defective memory component screening, in accordance with some embodiments of the present disclosure.

FIG. 5 is a flow diagram of an example method 500 of logic-based defective memory component screening, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the defectivity manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, the processing device reads a defective byte map of memory having separately accessible chunks of memory. Each chunk of memory has a number of bytes addressable in a physical and logical domain. Each chunk of the memory is allocated a number of bytes to repair defective bytes. As described with reference to FIG. 2, each portion of memory has a number of bytes addressable in a physical domain and a number of bytes addressable in a logical domain. The defective byte map indicates physical addresses of defective bytes of memory in a chunk of memory in the physical domain. As described with reference to operation 325 of FIG. 3, the defectivity manager 113 allocates redundant portions of memory to repair portions of the memory in the physical domain and/or the logical domain using a redundant memory bank.

At operation 510, the processing device maps a number of defective bytes in a chunk of a memory in the physical domain to a number of sub-segments of the memory in the logical domain. For example, the defectivity manager 113 maps the defective bytes as described with reference to operation 310 of FIG. 3.

At operation 515, the defectivity manager writes, to a portion of the memory, an address of a defective byte in the chunk of the memory for repair in response to determining that an available number of bytes allocated to repair defective bytes satisfies a number of defective bytes in a sub-segment of the number of sub-segments of the memory in the logical domain. For example, the defectivity manager 113 evaluates a defectivity of a sub-segment using a number of defective bytes of the sub-segment. As described with reference to operation 325 of FIG. 3, the defectivity manager 113 evaluates the defectivity of the sub-segment using the number of available redundant bytes. As described with reference to operation 330 of FIG. 3, the defectivity manager 113 evaluates the defectivity of any remaining bytes of the sub-segment (e.g., defective bytes in excess of the number of bytes of redundant memory allocated for repair) using ECC. Responsive to determining that the defective bytes can be repaired using redundant memory (e.g., the number of defective bytes of the sub-segment does not exceed available redundant bytes of memory) and any remaining defective bytes of the sub-segment can be forgiven using ECC (e.g., the remaining number of defective bytes of the sub-segment can be forgiven using the number of bytes ECC can repair), the defectivity manager 113 writes addresses of the defective bytes of memory to a different portion of memory (such as ROM or memory device 130 described in FIG. 1). By writing the addresses of the defective bytes to a different portion, the defectivity manager 113 redirects the defective bytes of memory in the sub-segment to the redundant bytes of memory allocated for repair. As described with reference to 335 of FIG. 3, the defectivity manager 113 maps the one or more defective bytes in a sub-segment of memory in the logical domain to the corresponding chunk of memory in the physical domain. The defectivity manager 113 then maps the address of the defective byte of memory in the chunk of the physical domain to one or more redundant bytes of memory in the redundant memory bank.

Figure 6:
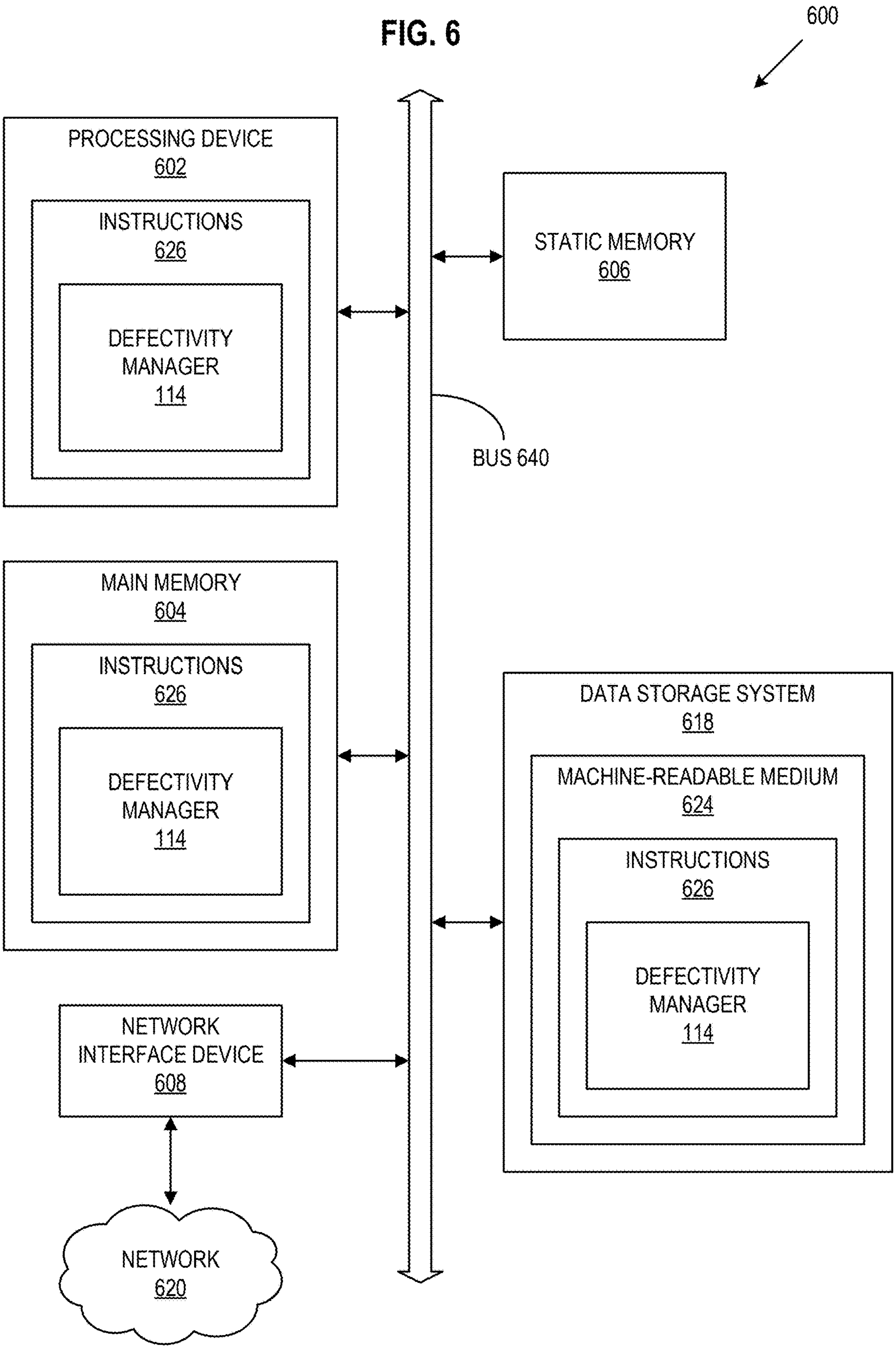
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the defectivity manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory subsystem 110 of FIG. 1.

In one embodiment, the instructions 626 include instructions to implement functionality corresponding to a defectivity manager (e.g., the defectivity manager 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 300 and/or 500 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:

reading a defective byte map of memory having separately accessible chunks of memory, each chunk of memory having a number of bytes addressable in a physical domain and a logical domain, and wherein each chunk of the memory is allocated a number of bytes to repair defective bytes;

mapping a number of defective bytes in a chunk of a memory in the physical domain to a number of subsegments of the memory in the logical domain; and writing, to a portion of the memory, an address of a defective byte in the chunk of the memory for repair in response to determining that an available number of bytes allocated to repair defective bytes satisfies a number of defective bytes in a sub-segment of the number of sub-segments of the memory in the logical domain.

2. The method of claim 1, wherein writing, to the portion of the memory, the address of the defective bytes in the chunk of memory for repair is part of mapping the address of the defective byte in the chunk of the memory to an address of a redundant byte of memory.

3. The method of claim 2, wherein the redundant byte of memory is one byte of a plurality of redundant bytes of memory allocated for repair, the method further comprising:

determining an updated number of the plurality of redundant bytes allocated for repair using the redundant byte mapped to the address of the defective byte in the portion of the memory.

4. The method of claim 1, further comprising:

determining a difference between the number of defective bytes in the sub-segment of the number of sub-segments and the available number of bytes allocated to repair defective bytes.

5. The method of claim 1, further comprising:

omitting, from repair, at least one defective byte from the number of defective bytes in the sub-segment.

6. The method of claim 5, wherein the at least one defective byte is omitted from repair according to an error correction capability of a memory system.

7. The method of claim 1, wherein the sub-segment of the number of sub-segments of the memory in the logical domain is a first sub-segment, further comprising:

responsive to determining that the first sub-segment is not a final sub-segment of the number of sub-segments, evaluating a defectivity of a next sub-segment of the number of sub-segments in the logical domain.

8. A non-transitory computer-readable storage medium comprising instructions that, when executed by a processing device, cause the processing device to:

read a defective byte map of memory having separately accessible chunks of memory, each chunk of memory having a number of bytes addressable in a physical domain and a logical domain, and wherein each chunk of the memory is allocated a number of bytes to repair defective bytes;

map a number of defective bytes in a chunk of a memory in the physical domain to a number of sub-segments of the memory in the logical domain; and write, to a portion of the memory, an address of a defective byte in the chunk of the memory for repair in response to determining that an available number of bytes allocated to repair defective bytes satisfies a number of defective bytes in a sub-segment of the number of sub-segments of the memory in the logical domain.

9. The non-transitory computer-readable storage medium of claim 8, writing, to the portion of the memory, the address of the defective bytes in the chunk of memory for repair is part of mapping the address of the defective byte in the chunk of the memory to an address of a redundant byte of memory.

10. The non-transitory computer-readable storage medium of claim 9, wherein the redundant byte of memory is one byte of a plurality of redundant bytes of memory allocated for repair, and wherein the processing device is further to:

determine an updated number of the plurality of redundant bytes allocated for repair using the redundant byte mapped to the address of the defective byte in the portion of the memory.

11. The non-transitory computer-readable storage medium of claim 8, wherein the processing device is further to:

determine a difference between the number of defective bytes in the sub-segment of the number of sub-segments and the available number of bytes allocated to repair defective bytes.

12. The non-transitory computer-readable storage medium of claim 8, wherein the processing device is further to:

omit, from repair, at least one defective byte from the number of defective bytes in the sub-segment.

13. The non-transitory computer-readable storage medium of claim 12, wherein the at least one defective byte is omitted from repair according to an error correction capability of a memory system.

14. The non-transitory computer-readable storage medium of claim 8, wherein the sub-segment of the number of sub-segments of the memory in the logical domain is a first sub-segment, and wherein the processing device is further to:

responsive to determining that the first sub-segment is not a final sub-segment of the number of sub-segments, evaluating a defectivity of a next sub-segment of the number of sub-segments in the logical domain.

15. A system comprising:

a plurality of memory devices; and a processing device, operatively coupled with the plurality of memory devices, to:

read a defective byte map of memory having separately accessible chunks of memory, each chunk of memory having a number of bytes addressable in a physical domain and a logical domain, and wherein each chunk of the memory is allocated a number of bytes to repair defective bytes;

map a number of defective bytes in a chunk of a memory in the physical domain to a number of sub-segments of the memory in the logical domain; and map an address of a defective byte in the chunk of memory to an address of a redundant byte of memory by writing, to a portion of the memory, the address of the defective byte in the chunk of the memory for repair and the address of the redundant memory, in response to determining that an available number of bytes allocated to repair defective bytes satisfies a number of defective bytes in a sub-segment of the number of sub-segments of the memory in the logical domain.

16. The system of claim 15, wherein the redundant byte of memory is one byte of a plurality of redundant bytes of memory allocated for repair, and wherein the processing device is further to:

determine an updated number of the plurality of redundant bytes allocated for repair using the redundant byte mapped to the address of the defective byte in the portion of the memory.

17. The system of claim 15, wherein the processing device is further to:

determine a difference between the number of defective bytes in the sub-segment of the number of sub-segments and the available number of bytes allocated to repair defective bytes.

18. The system of claim 15, wherein the processing device is further to:

omit, from repair, at least one defective byte from the number of defective bytes in the sub-segment.

19. The system of claim 18, wherein the at least one defective byte is omitted from repair according to an error correction capability of a memory system.

20. The system of claim 15, wherein the sub-segment of the number of sub-segments of the memory in the logical domain is a first sub-segment, and wherein the processing device is further to:

responsive to determining that the first sub-segment is not a final sub-segment of the number of sub-segments, evaluating a defectivity of a next sub-segment of the number of sub-segments in the logical domain.

* * * * *